(12) United States Patent
Lai et al.

(10) Patent No.: US 6,633,464 B2
(45) Date of Patent: Oct. 14, 2003

(54) SYNTHETIC ANTIFERROMAGNETIC PINNED LAYER WITH FE/FESI/FE SYSTEM

(75) Inventors: Chih-Huang Lai, Hsinchu (TW); Zhupei Shi, San Jose, CA (US); Hua-Ching Tong, San Jose, CA (US); Robert E. Rottmayer, Fremont, CA (US); Charles W. Miller, San Jose, CA (US)

(73) Assignee: Read-Rite Corporation, Fremont, CA (US)

( * ) Notice: Subject to any disclaimer, the term of this patent is extended or adjusted under 35 U.S.C. 154(b) by 85 days.

(21) Appl. No.: 09/209,060

(22) Filed: Dec. 9, 1998

(65) Prior Publication Data

US 2001/0012187 A1 Aug. 9, 2001

(51) Int. Cl.$^7$ ................................................ G11B 5/39
(52) U.S. Cl. .................................................. 360/324.1
(58) Field of Search ......................... 360/325, 326, 360/327, 327.1, 327.11, 327.2, 327.21, 327.22, 327.23, 327.24, 327.3, 327.31, 327.32, 327.33, 113, 324.1, 324

(56) References Cited

U.S. PATENT DOCUMENTS

| | | | |
|---|---|---|---|
| 5,465,185 A | | 11/1995 | Heim et al. |
| 5,668,685 A | * | 9/1997 | Soeya et al. ............ 360/327.32 |
| 5,701,222 A | | 12/1997 | Gill et al. |
| 5,701,223 A | | 12/1997 | Fontana, Jr. et al. |
| 5,739,990 A | * | 4/1998 | Ravipati et al. ............ 360/113 |
| 5,768,067 A | * | 6/1998 | Saito et al. ................. 360/113 |
| 5,804,250 A | * | 9/1998 | Yang ........................... 427/130 |
| 5,849,422 A | * | 12/1998 | Hayashi ....................... 428/611 |
| 5,976,713 A | * | 11/1999 | Fuke et al. .................. 428/692 |
| 6,002,555 A | * | 12/1999 | Tagawa ....................... 360/126 |

OTHER PUBLICATIONS

S. S. P. Parkin et al., "Oscillations in Exchange Coupling and Magnetoresistance in Metallic Superlattice Structures: Co/Ru, Co/Cr, and Fe/Cr" 1990, The American Physical Society, Physical Review Letters, vol. 64, No. 19, pp. 2304–2307.

Zhu–Pei Shi et al., "Antiferromagnetic Bias in the Interlayer Magnetic Coupling," May 20, 1994, Europhysics Letters, 26(6), pp. 473–478.

J.J. deVries et al., "Exponential Dependence of the Interlayer Exchange Coupling on the Spacer Thickness in MBE–grown Fe/SiFe/Fe Sandwiches," Apr. 14, 1997, The American Physical Society, Physical Review Letters, vol. 78, No. 15, pp. 3023–3026.

P. Bruno et al., "Oscillatory Coupling between Ferromagnetic Layers Separated by a Nonmagnetic Metal Spacer," Sep. 16, 1991, The American Physical Society, Physical Review Letters, vol. 67, No. 12, pp. 1602–1605.

Zhu–Pei Shi et al., "Interlayer Magnetic Coupling in Metallic Multilayer Structures," Jun. 1, 1994, The American Physical Society, Physical Review B, vol. 49, No. 1, pp. 15–159–15–178.

* cited by examiner

Primary Examiner—George J. Letscher

(57) ABSTRACT

A magnetoresistive (MR) device includes a synthetic antiferromagnetic (AFM) layer having an Fe/FeSi/Fe construction. A first Fe layer of the synthetic AFM layer has a magnetization substantially in a first direction, while a second Fe layer of the synthetic AFM layer has a magnetization substantially in a second direction that is substantially antiparallel to the first direction. The magnetoresistive device can be a spin valve in which a first surface of the synthetic AFM layer is adjacent to a pinning layer, and a second surface of the synthetic AFM layer is adjacent to a spacer layer. Further, the spin valve includes a free layer that overlies the spacer, thereby being separated from the synthetic AFM layer by the spacer. The pinning layer, synthetic AFM layer, spacer, and free layer can be bounded by a first shield and a second shield to provide magnetic shielding of the spin valve sensor.

20 Claims, 8 Drawing Sheets

SYNTHETIC ANTIFERROMAGNETIC PINNED LAYER WITH FE/FESI/FE SYSTEM

BACKGROUND OF THE INVENTION

This invention relates generally to magnetic disk data storage systems, more particularly to magnetoresistive (MR) read heads, and most particularly to structures incorporating an Fe/FeSi/Fe synthetic antiferromagnetic (AFM) pinned layer and methods for making same.

Magnetic disk drives are used to store and retrieve data for digital electronic apparatuses such as computers. In FIGS. 1A and 1B, a magnetic disk data storage systems 10 of the prior art includes a sealed enclosure 12, a disk drive motor 14, a magnetic disk 16, supported for rotation by a drive spindle S1 of motor 14, an actuator 18 and an arm 20 attached to an actuator spindle S2 of actuator 18. A suspension 22 is coupled at one end to the arm 20, and at its other end to a read/write head or transducer 24. The transducer 24 typically includes an inductive write element with a sensor read element (which will be described in greater detail with reference to FIG. 1C). As the motor 14 rotates the magnetic disk 16, as indicated by the arrow R, an air bearing is formed under the transducer 24 causing it to lift slightly off of the surface of the magnetic disk 16, or, as it is termed in the art, to "fly" above the magnetic disk 16. Alternatively, some transducers, known as "contact heads," ride on the disk surface. Various magnetic "tracks" of information can be read from the magnetic disk 16 as the actuator 18 causes the transducer 24 to pivot in a short arc as indicated by the arrows P. The design and manufacture of magnetic disk data storage systems is well known to those skilled in the art.

FIG. 1C depicts a magnetic read/write head 24 including a write element 26 and a read element 28. The edges of the write element 26 and read element 28 also define an air bearing surface ABS, in a plane 29, which faces the surface of the magnetic disk 16.

The write element 26 is typically an inductive write element. A write gap 30 is formed between an intermediate layer 31, which functions as a first pole, and a second pole 32. Also included in write element 26, is a conductive coil 33 that is positioned within an electrical insulator 34, such as a cured photoresistive material. As is well known to those skilled in the art, these elements operate to magnetically write data on a magnetic medium such as a magnetic disk 16.

The read element 28 includes a first shield 36, the intermediate layer 31, which functions as a second shield, and a read sensor 40 that is located between the first shield 36 and the second shield 31. The most common type of read sensor 40 used in the read/write head 30 is the magnetoresistive sensor. A magnetoresistive (MR) sensor is used to detect magnetic field signals by means of a changing resistance in the read sensor. When there is relative motion between the MR sensor and a magnetic medium (such as a disk surface), a magnetic field from the medium can cause a change in the direction of magnetization in the read sensor, thereby causing a corresponding change in resistance of the read element. The change in resistance can be detected to recover the recorded data on the magnetic medium.

One type of conventional MR sensor utilizes the anisotropic magnetoresistive (AMR) effect for such detection, where the read element resistance varies in proportion to the square of the cosine of the angle between the magnetization in the read sensor and the direction of a sense current flowing through the read sensor. Another type of MR sensor uses a phenomenon known as the giant magnetoresistive (GMR) effect. In such devices, the read sensor resistance is independent of the sense current direction, but varies in proportion to the cosine of the angle between the magnetizations of nearby layers. In a spin valve GMR sensor, two ferromagnetic layers are separated by a non-magnetic metal layer, sometimes referred to as a spacer layer. One of the ferromagnetic layers is a "free" layer, whose magnetization can be moved by external magnetic fields. The other ferromagnetic layer is a "pinned" layer whose magnetization is set in a particular direction and resistant to changes of that direction by external magnetic fields. This pinning is typically achieved with an exchanged-coupled antiferromagnetic (AFM) layer adjacent to the pinned layer.

In FIG. 2, a view taken along line 2—2 of FIG. 1C (i.e., perpendicular to the plane 29 and therefore perpendicular to the air bearing surface ABS) illustrates the structure of the read sensor 40, in the form of a spin valve read sensor of the prior art. The spin valve read sensor 40 includes a free layer 42, a non-magnetic metal spacer layer 44, and a pinned layer 46 which together form the sensing layers 47. In addition, the read sensor 40 includes an antiferromagnetic (AFM) pinning layer 48 that pins the magnetization of the adjacent pinned layer 46. The spin valve read sensor 40 is supported by a substrate 50 (which can be the first shield 36) and a buffer layer 52, while a capping layer (not shown) can be provided over the AFM layer 48. Although not shown in FIG. 2, leads, typically made from gold or another low resistance material, route a sense current from a current source to the spin valve read sensor 40, while signal detection circuitry detects changes in resistance of the read sensor 40 as it encounters magnetic fields.

The free and pinned layers 42 and 46 are typically made from a soft ferromagnetic material such as Permalloy, while the non-magnetic metal spacer layer 44 can be formed of copper (Cu). The pinning layer 48 is formed of an antiferromagnetic (AFM) material that is used to set the magnetic direction of the pinned layer 46, preventing the magnetization of the pinned layer 46 from rotating under most operating conditions. The antiferromagnetic material of the pinning layer 48 can be, for example, a manganese (Mn) alloy such as iron-manganese (FeMn) or an oxide such as nickel-oxide (NiO).

The function of the pinned layer 46 can be better understood with reference to the magnetization directions depicted in FIG. 2. The pinned layer 46 is magnetized as indicated by the arrow 43. Alone, the free layer 42 may have an initial magnetization as indicated by the dashed arrow 45. However, in a spin valve such as that depicted in FIG. 2, there is a magnetostatic coupling of the pinned layer 46, a ferromagnetic exchange coupling through the non-magnetic metal spacer layer 44, and a field generated by the sense current I. Thus, the free layer 42 can have an actual magnetization direction as illustrated by the arrow 41 (which appears as a point in FIG. 2 because it is directed into the plane 29), which is due to the sum of the initial magnetization 45, the magnetostatic coupling of the pinned layer 46, the ferromagnetic exchange coupling though the spacer layer 44, and the field generated by the sense current I.

Other spin valve read sensors have been developed which use a multilayer pinned layer in place of the single pinned layer 46 of FIG. 2. Such a pinned layer 46' is shown in FIG. 3, formed of a first ferromagnetic (FM) layer 54 that is separated from a second FM layer 55 by a non-magnetic spacer layer 56. Specifically, such a read sensor has been developed with the first and second FM layers formed of cobalt and the spacer layer formed of ruthenium (Ru). The magnetization 57 of the first FM layer is set in a first direction, while the magnetization 58 of the second FM layer is set in a second direction that is substantially antiparallel to the first direction. The two FM layers are strongly antiferromagnetically coupled in an antiparallel orientation, and their magnetizations are pinned by the pinning layer 48. Thus, the magnetization of the pinned layer 53 is significantly resistant to perturbation by the external magnetic fields used to change the magnetization 41 of the free layer 42.

FIG. 4 is a graph of the saturation field (Hs) of a spin valve read sensor incorporating a pinned layer such as that shown in FIG. 3, as it varies with thickness of the spacer layer. The saturation field is directly correlated with the coupling strength between the first and second FM layers, and is an indicator of read sensor performance. As can be seen from the graph, the saturation field follows an oscillation referred to as Ruderman-Kittel-Kasuya-Yosida (RKKY) oscillation, with high saturation fields being experienced only with small spacer layer thicknesses. For example, saturation fields above 2,000 oersteds can be achieved only with thicknesses smaller than about 8 angstroms. Further, as the steep slope of the depicted curve below about 8 angstroms indicates, very small variances in thickness will result in relatively large differences in saturation field. Thus, fabrication of a spin valve using the pinned layer 46' of FIG. 3 requires very precise thickness control. This requirement can add to the cost of read sensors, for example through requiring more expensive control equipment to ensure proper thicknesses or lower yields due improper thicknesses.

Thus, what is desired is an improved pinning layer for use in magnetoresistive devices, such as spin valve devices. In particular, a pinning layer that maximizes performance while being easier and less expensive to manufacture is needed.

SUMMARY OF THE INVENTION

The present invention provides a magnetoresistive device and method for making the same that provides high performance and can be fabricated with low cost and low complexity. Specifically, a synthetic AFM layer is provided that can be used as a pinned layer of a spin valve read sensor and can be fabricated with a spacer layer having larger thicknesses, and a larger range of thicknesses, than in the prior art, while still providing high levels of spin valve performance. These larger thicknesses and larger range of thicknesses allow for easier control of the spacer layer fabrication, and therefore lower cost of producing larger quantities of magnetoresistive devices that include the synthetic AFM layer.

According to an embodiment of the present invention, a magnetoresistive device includes a synthetic antiferromagnetic (AFM) layer having a first ferromagnetic (FM) layer including iron (Fe) and a second FM layer including Fe. The first FM layer and second FM layer are separated by an intermediate layer including Fe and silicon (Si). The first FM layer has a magnetization that is pinned in a first direction, while the second FM layer has a magnetization that is pinned in a second direction that is substantially antiparallel to the first direction. The magnetoresistive device further includes a spacer layer overlying the synthetic AFM layer, with the second FM layer being proximate the spacer layer and the first FM layer being distal the spacer layer. Additionally, the magnetoresistive device includes a free layer overlying the spacer layer and formed of a ferromagnetic material. In a particular embodiment, the intermediate layer includes an iron-silicon alloy, i.e., iron-silicide. A magnetoresistive device having such a synthetic AFM layer provides high saturation fields, while incorporating a spacer which can have a thickness that is easy to fabricate.

In another embodiment of the present invention, a system for reading from and writing to a magnetic medium includes a write element and a read element. Specifically, the read element includes a spin valve magnetoresistive device having a synthetic antiferromagnetic (AFM) layer. The synthetic AFM layer includes a first FM layer, consisting essentially of iron (Fe), separated from a second FM layer, consisting essentially of Fe, by a first spacer layer that consists essentially of Fe and silicon (Si). In particular embodiments, the first space layer can consist essentially of iron-silicide (FeSi). The system for reading from and writing to a magnetic medium can also include a medium support that is capable of supporting a medium and moving the medium in relation to a read/write head that includes the write element and the read element. Also included can be a read/write head support system for suspending the read/write head above the medium. With the synthetic AFM pinned layer of the present invention, a magnetic data storage system can render high performance while keeping fabrication costs low.

In yet another embodiment of the present invention, a method of forming a magnetoresistive device, includes providing a substrate and forming a synthetic AFM layer having a first iron (Fe) layer and a second iron (Fe) layer separated by an iron-silicide (FeSi) layer. The formation of the synthetic AFM layer can include depositing a first Fe initial layer over the substrate, depositing a silicon (Si) layer over the first Fe initial layer, and depositing a second Fe initial layer over the Si layer. The method also includes heating the first Fe initial layer, the Si layer, and the second Fe initial layer until material from at least one of the first Fe initial layer and the second Fe initial layer propagates into the Si layer to transform the Si layer into the FeSi layer. Alternatively, a combined layer of Fe and Si can be deposited on a first Fe initial layer and covered with a second Fe initial layer. The combined layer is heated to form the FeSi layer. A pinning layer can also be formed between the substrate and the synthetic AFM layer. This method produces a read sensor that experiences high saturation fields while requiring reduced spacer layer thickness control during fabrication. Also, the formation of the iron-silicide spacer layer can be conducted at temperatures and for time periods consistent with the field annealing procedure of the pinning layer.

These and other advantages of the present invention will become apparent to those skilled in the art upon a reading of the following descriptions of the invention and a study of the several figures of the drawing.

BRIEF DESCRIPTION OF THE DRAWINGS

The present invention will be readily understood by the following detailed description in conjunction with the accompanying drawings, and like reference numerals designate like elements.

DETAILED DESCRIPTION OF THE PREFERRED EMBODIMENTS

Figure 1A:
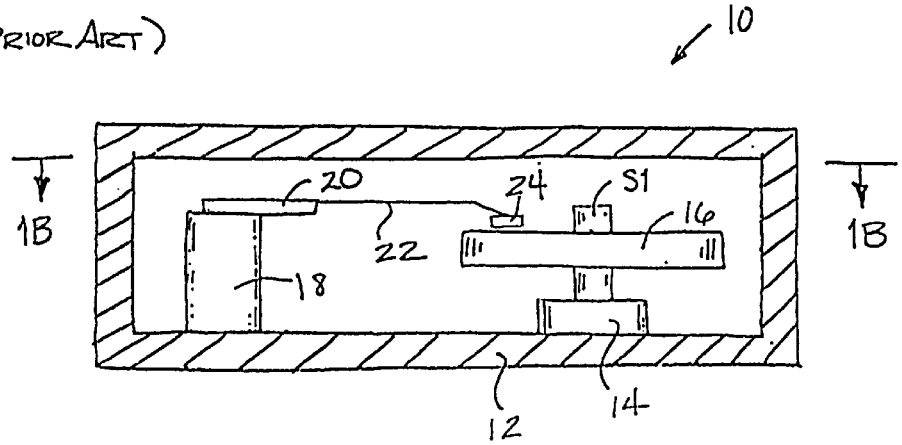
FIG. 1A is a partial cross-sectional front elevation view of a magnetic data storage system.
Figure 1B:
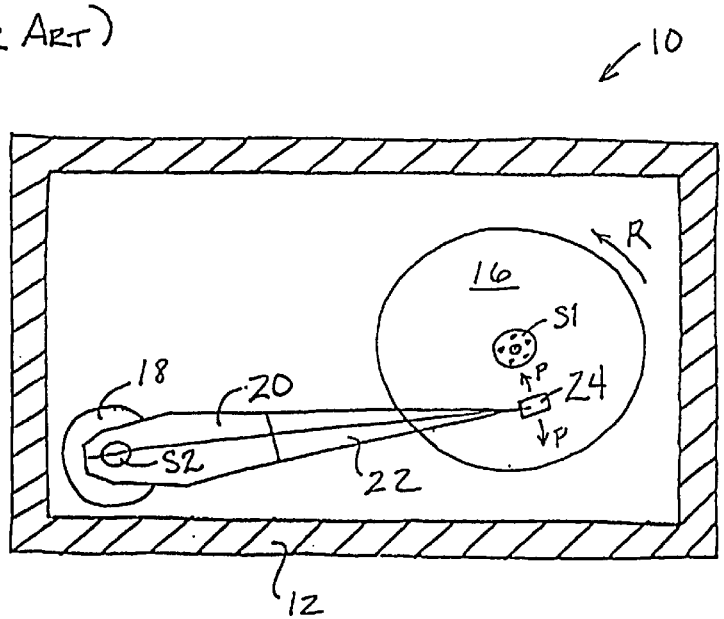
FIG. 1B is a top plan view along line 1B—1B of FIG. 1A.
Figure 1C:
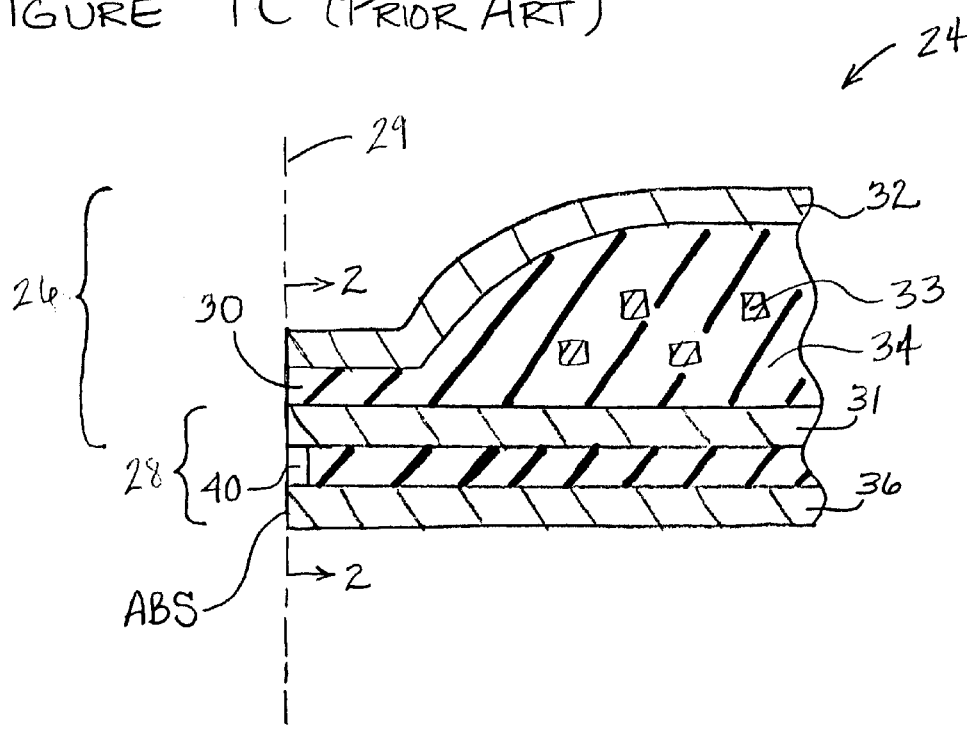
FIG. 1C is a cross-sectional view of a prior art read/write head of the magnetic disk drive assembly of FIGS. 1A and 1B.
Figure 2:
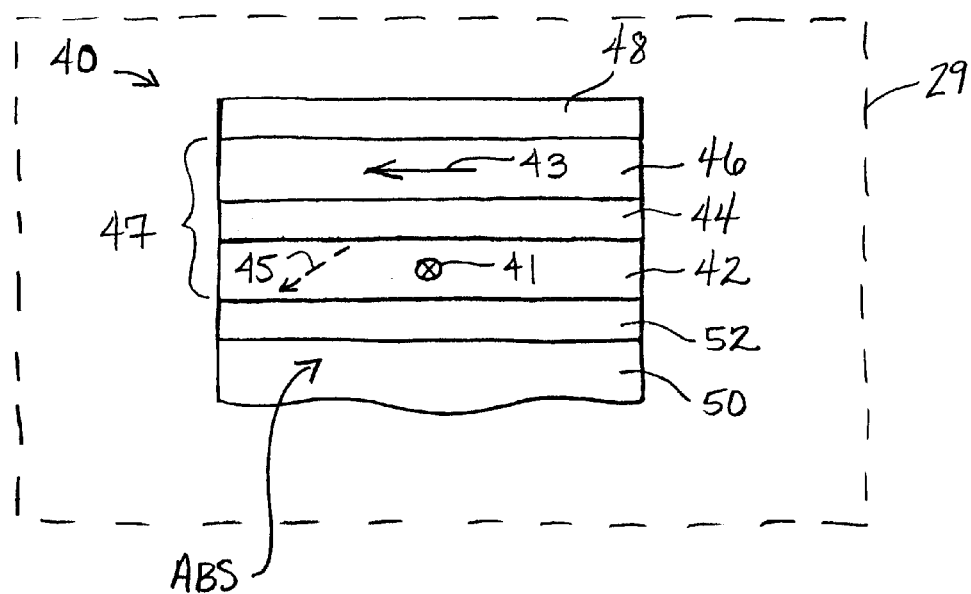
FIG. 2 is a partial end view of a prior art read sensor of the read/write head of FIG. 1C.
Figure 3:
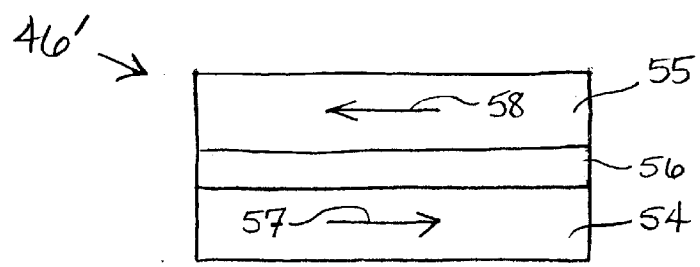
FIG. 3 is an end view of a prior art synthetic antiferromagnetic (AFM) layer.
Figure 4:
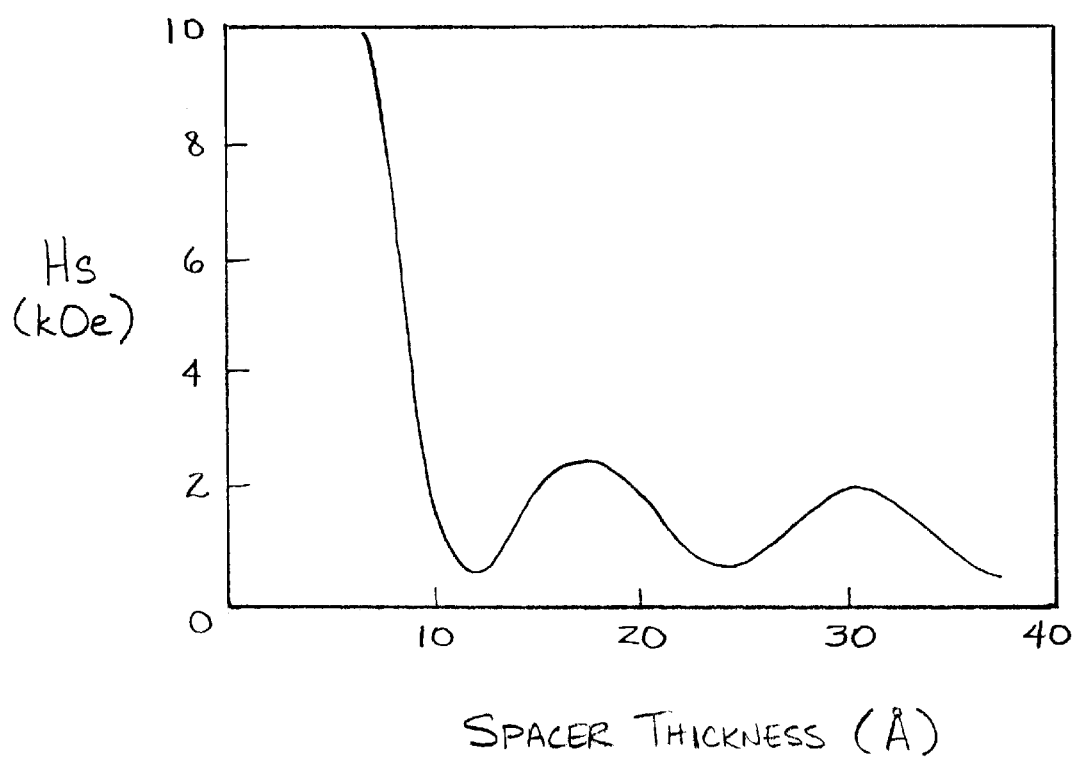
FIG. 4 is a graph of a saturation field versus intermediate layer thickness of a spin valve read sensor utilizing the prior art synthetic AFM layer of FIG. 3.
Figure 5:
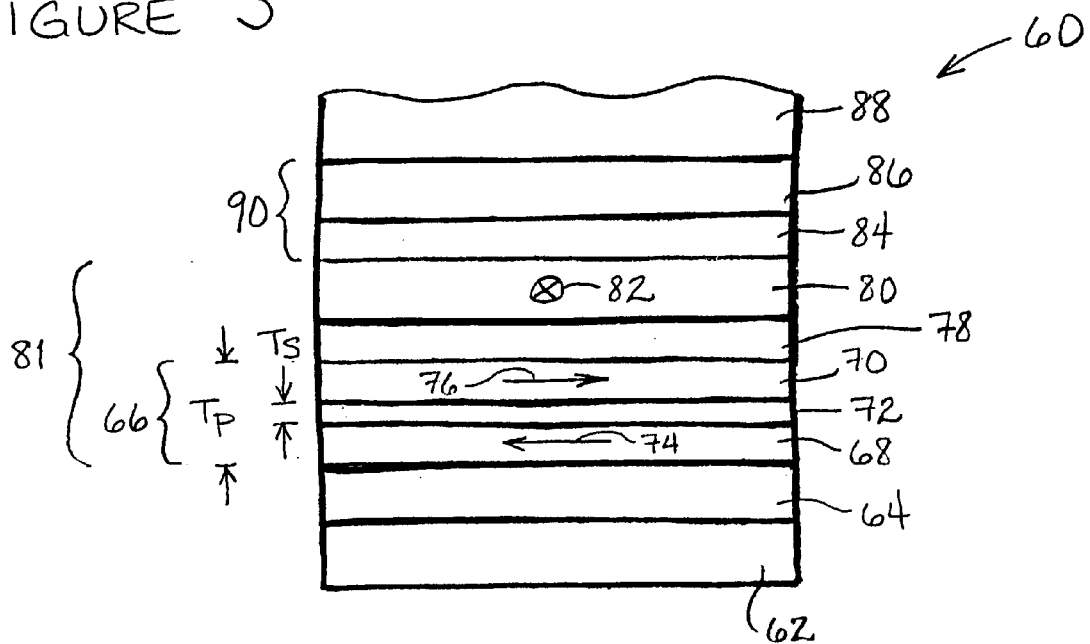
FIG. 5 is a partial end view of a spin valve read sensor utilizing a synthetic AFM layer according to an embodiment of the present invention.

FIGS. 1–4 were discussed with reference to the prior art. FIG. 5 depicts a spin valve read element 60, according to one embodiment of the present invention. A first shield 62, formed of NiFe or a material with similar shielding properties, is covered by a pinning layer 64. To provide appropriate pinning of the magnetization of a subsequently formed synthetic AFM pinned layer 66, the pinning layer 64 is formed of an antiferromagnetic (AFM) material, such as NiO, NiCoO, NiFeO, or $Fe_2O_3$. When an oxide is used to form the pinning layer 64, it can also serve as an insulating gap material between the first shield 62 and the sensing layers 81. The thickness of the pinning layer 64 is appropriately sized to provide sufficient pinning of the first ferromagnetic layer 68. The thickness of the pinning layer 64 can also be driven by the desired spacing between the first shield 62 and the synthetic AFM pinned layer 66, so as to provide desired shielding of the MR sensor.

The synthetic AFM pinned layer 66 overlies the pinning layer 64 and includes a plurality of layers. In the embodiment depicted in FIG. 5, the synthetic AFM pinned layer 66 includes two ferromagnetic layers 68 and 70 separated by a spacer layer 72 formed of non-magnetic material. Specifically, the first ferromagnetic (FM) layer 68 and second FM layer 70 of the present embodiment are formed of iron (Fe). The magnetization of the first FM layer 68 is in a first direction indicated by the arrow 74, while the magnetization of the second FM layer 70 is in a second direction indicated by the arrow 76. As indicated in FIG. 5, the first FM layer magnetization 74 is substantially antiparallel to the second FM layer magnetization 76. It is this antiparallel nature of the magnetization of the two ferromagnetic layers that gives the synthetic AFM pinned layer 66 its antiferromagnetic qualities.

The spacer layer 72 of the synthetic AFM pinned layer 66 is formed of an iron-silicon (FeSi) combination. Specifically, the spacer layer 72 is formed of iron-silicide. The iron-silicide can have from 25%–75% formed from Fe, with the remainder formed from Si. More specifically, a 50/50 Fe/Si ratio works well. The thickness Ts of the spacer layer 72 can be in the range of about 5 angstroms to about 25 angstroms, and more preferably between about 10 angstroms and about 20 angstroms.

The spin valve read element 60 further includes a metal spacer 78 overlying the synthetic AFM pinned layer 66. The metal spacer 78 is formed of a non-magnetic material, such as copper (Cu) with a thickness that provides suitable spacing between the synthetic AFM pinned layer 66 and a free layer 80. The free layer 80 is formed of a soft ferromagnetic material overlying the metal spacer 78. The magnetization of the free layer 80 is set in a particular direction, which in FIG. 5 is substantially perpendicular to the first FM layer magnetization 74 and to the second FM layer magnetization 76. The magnetization of the free layer 80 is indicated by the point indicator 82 which denotes a vector into the viewing plane of FIG. 5. The soft FM material used in the free layer 80 can be CoFe, NiFe, or other ferromagnetic materials whose magnetization can be easily affected by external magnetic fields, and can have a thickness in the range of about 10 angstroms to about 80 angstroms.

Over the free layer 80, a spacer layer 84 is formed of a non-magnetic metal material such as tantalum (Ta). Gap fill material 86 is disposed above spacer layer 84 and below a second shield 88. The gap fill material 86 and spacer layer 84 form a separation layer 90, that, by appropriate thickness of each constituent layer, provides a desired separation between the free layer 80 and the second shield 88. To provide this separation, it is desired that the gap fill material be an insulating material, such as alumina ($Al_2O_3$). With appropriate separation, desired shielding of the sensing layers 81 can be achieved. The second shield 88 can be formed of an appropriate material, such as NiFe.

Figure 6A:
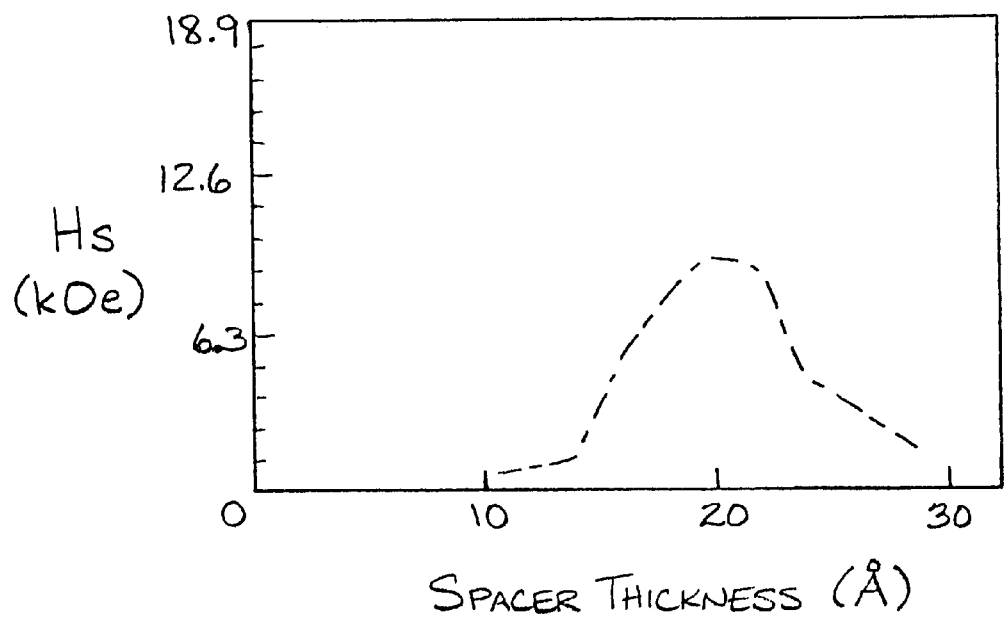
FIG. 6A is a graph of the saturation field versus intermediate layer nominal thickness of the spin valve read sensor of FIG. 5, according to an embodiment of the present invention.

To exemplify thicknesses of the spacer layer 72 that can provide sufficient performance of the spin valve read element 60, reference can be made to a plot of saturation field Hs (kOe) versus thickness Ts (angstroms) of the spacer layer 72. As can be seen in the graph of FIG. 6A, a saturation field of about 10,000 oersteds can be achieved with a spacer layer thickness Ts of up to 20 angstroms. This indicates strong antiferromagnetic exchange coupling within the Fe/FeSi/Fe sensing layers 81. Thus, in contrast with the response of the prior art spin valve read sensor indicated by the chart of FIG. 4 (discussed above with reference to the prior art), it can be seen that the present invention can be practiced with a large spacer layer thickness Ts while still achieving high saturation field levels. Because high performance can be gained with such large spacer layer thicknesses, the spacer layer thickness is easily controlled, unlike the challenge of thickness control faced in the prior art.

Figure 6B:
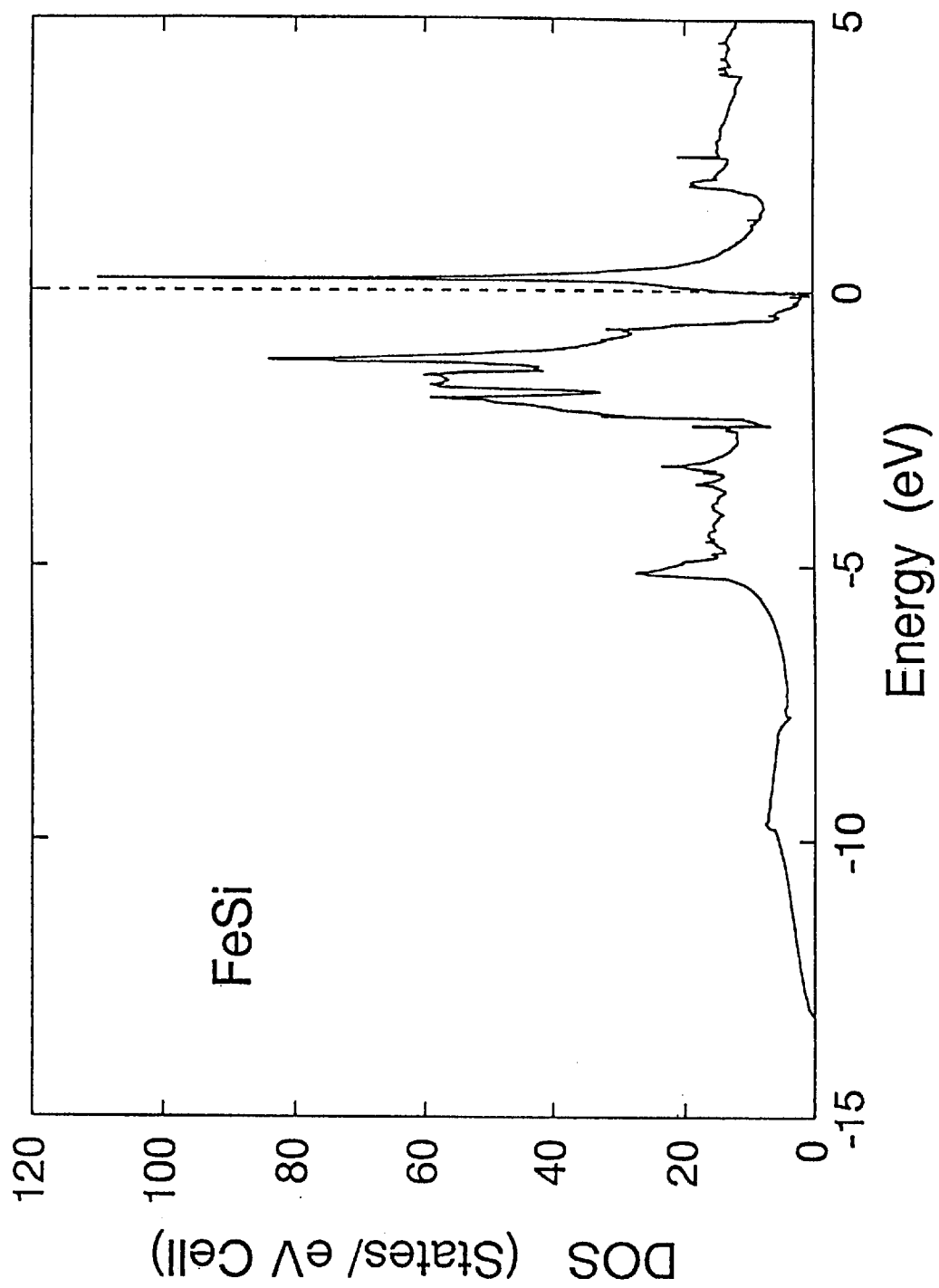
FIG. 6B is a graph of the density of states (DOS) of FeSi.

Also, the curve of FIG. 6A suggests that the synthetic AFM pinned layer 66 of the present invention always provides antiferromagnetic coupling without RKKY oscillation. This is supported by understanding that the density of states (DOS) of FeSi has a strong peak just above the Fermi surface as shown in FIG. 6B. This feature of the DOS indicates a strong AFM coupling, as can be better understood with reference to *Antiferromagnetic Bias in the Interlayer Magnetic Coupling,* Zhupei Shi et al., Europhys. Lett., 26 (6), pp. 473–478, 1994. The dependence of the AFM coupling strength on the thickness of the spacer layer can be further understood by referring to *Exponential Dependence of the Interlayer Exchange Coupling on the Spacer Thickness in MBE-grown Fe/SiFe/Fe Sandwiches,* J. J. de Vries et al., Physical Review Letters, Vol. 78, No. 15, The American Physical Society, Apr. 14, 1997, incorporated herein by reference. Thus, the range of spacer thicknesses available in the prior art to achieve high levels of performance, is much greater than is the case with the prior art, which exhibits an RKKY oscillation, as shown in FIG. 4. With high performance achievable across a large range of spacer layer thicknesses, less control of this thickness is required during fabrication with the present invention, which can result in higher production yields.

Figure 7:
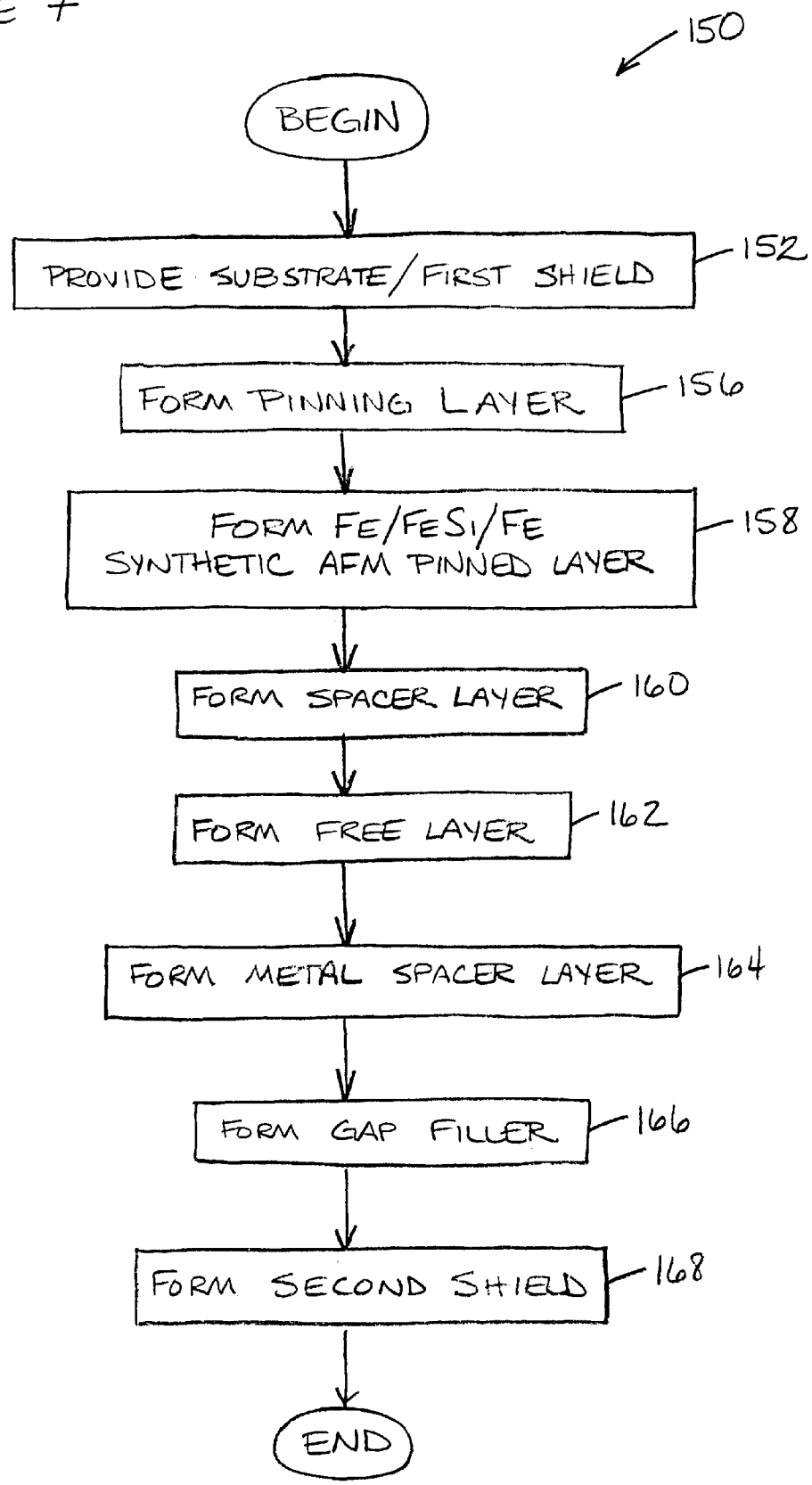
FIG. 7 is a flow chart of a method for fabricating a spin valve read sensor including a synthetic AFM layer, according to an embodiment of the present invention.

Because of a very small net magnetic moment of the synsthetic AFM, only a small exchange field is needed to prevent the rotation of the pinned layer, and therefore the synthetic AFM pinned layer 66, as taught by the present invention, has enhanced thermal stability. Generally speaking, the exchange bias field or pinning field from AFM materials such as NiO may be alleviated as temperature goes up. However, strong AFM coupling in the structure of the present embodiment has a strong ability to resist the effect of any magnetic stray field on the pinned layer 66. In other words, the synthetic AFM pinned layer 66 can provide stable magnetization initialized by the AFM materials, even at high operation temperatures experienced by magnetic data storage systems. FIG. 7 is a flow chart of a method 150 for producing a spin valve read sensor incorporating a synthetic AFM pinned layer according to an embodiment of the present invention. In operation 152, a substrate is provided. The substrate can be formed of any suitable material known to those skilled in the art, such as silicon, glass, or a suitable ceramic material. In the case of a shielded spin valve read sensor, the substrate can act as a first shield when formed of an appropriate material, such as NiFe. A pinning layer is formed above the first shield in operation 156. To provide appropriate pinning of subsequently formed layers, the pinning layer is formed a suitable antiferromagnetic material, such as NiO, NiCoO, NiFeO, or $Fe_2O_3$. In operation 158 a synthetic AFM pinned layer is formed. The synthetic AFM pinned layer of the present invention has the construction Fe/FeSi/Fe. As an example, operation 158 can include the use of molecular beam epitaxy (MBE) techniques. However, alternate formations of this construction in operation 158 are described in further detail with reference to FIGS. 8 and 9.

The formation of the spin valve according to the present invention further includes operation 160 where a spacer layer is formed above the synthetic AFM pinned layer. The spacer is formed of a non-magnetic metal material such as copper, and is formed using known method such as various applicable sputtering techniques. A free layer is formed above the spacer layer in operation 152 to complete the sensing layers in conjunction with the synthetic AFM pinned layer and spacer formed in operations 158 and 160. The free layer formed in operation 162, using known methods and techniques, can be formed of any suitable ferromagnetic material, such as CoFe, or Permalloy, NiFe. A metal spacer is also formed overlying the free layer in operation 164. The metal spacer can be formed of any suitable non-magnetic metal material such as Tantalum (Ta). A gap fill layer is also formed in operation 166 overlying the metal spacer. In conjunction with the metal spacer formed in operation 164, the gap fill layer formed in 166 provides a separation layer between the free layer formed in operation 162 and a second shield that is formed in operation 168. To provide proper separation, and thereby yield desired shielding of the sensing layers, an appropriate thickness of a suitable insulating material such as $Al_2O_3$ is used to form the gap fill layer.

Figure 8:
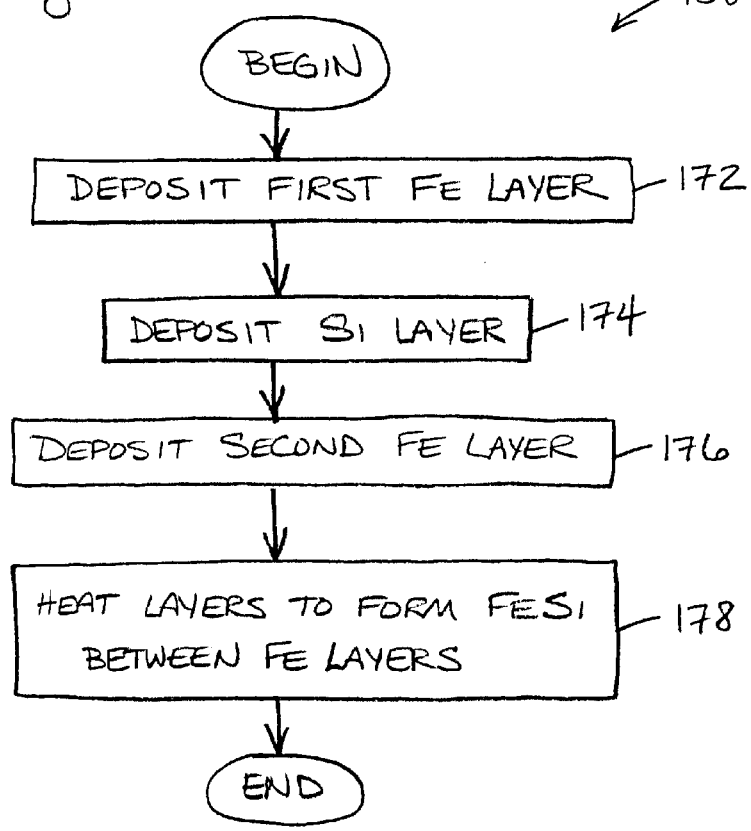
FIG. 8 is a flow chart depicting the operations of one of the operations in FIG. 7, according to an embodiment of the present invention.

FIG. 8 is a flow chart of an operation 158' used to perform operation 158 of FIG. 7, according to an embodiment of the present invention. Operation 158' begins with a deposition of a first Fe layer in operation 172. A Si layer is then deposited over the first Fe layer in operation 174. In operation 176, a second Fe layer is deposited over the Si layer of operation 174. In operation 178, the first Fe layer, the second Fe layer and the Si layer are heated. The heating of operation 178 is in the range of about 150 degrees Celsius to about 250 degrees Celsius, with heating of about 200 degrees Celsius working well. The heating of operation of 178 results in the formation of an iron silicide layer sandwiched between two layers of Fe.

Figure 9:
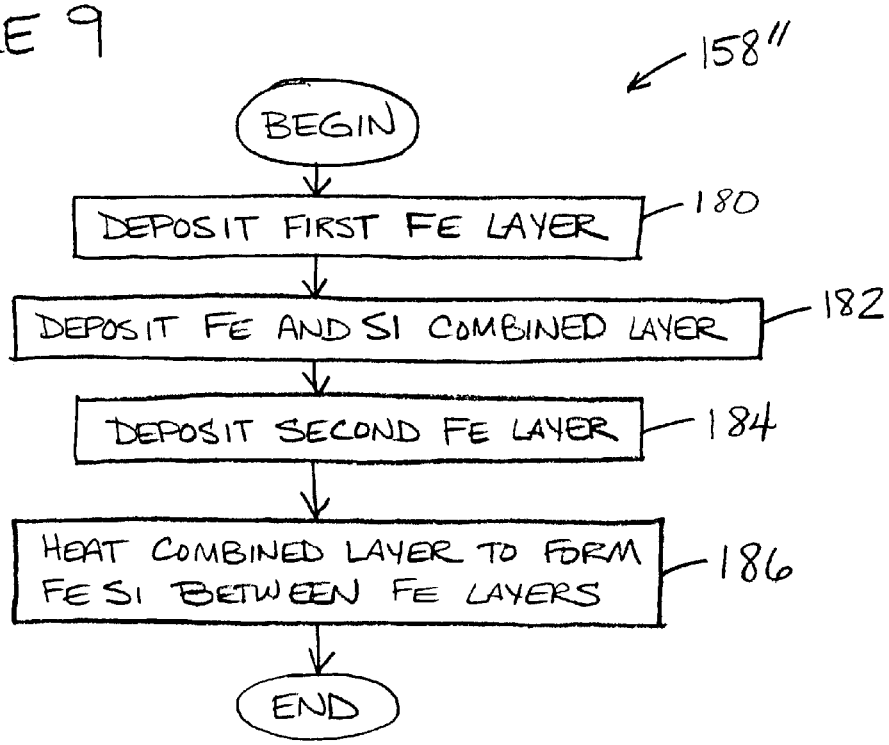
FIG. 9 is a flow chart depicting the operations of one of the operations in FIG. 7, according to another embodiment of the present invention.

FIG. 9 is a flow chart of an alternate operation 158" for forming the synthetic AFM pinned layer according to another embodiment of the present invention. As with operation 172 in FIG. 8, a first Fe layer is deposited in operation 180. In contrast though, operation 182 involves the deposition of Fe and Si in a combined layer above the first Fe layer. Operation 184, like operation 176 in FIG. 8, involves the deposition of a second Fe layer, here above the Fe and Si layer. In operation 186 the combined layer is heated to form an iron silicide layer sandwiched between layers of Fe. Thus, in operation 158' of FIG. 8 the formation of iron silicide is due to the propagation of Fe from the first Fe layer and second Fe layer into the Si layer, and vice versa, while operation 186 of operation 158" in FIG. 9 primarily involves the amalgamation of the Fe and Si deposited at the same time in operation 182. The Fe and Si can be deposited using known techniques and processes, such as sputtering, to control the fractional composition of the iron silicide layer.

The fabrication of the spin valve read sensor further includes setting of the pinning layer magnetization, sometimes referred to as field annealing. As is well known in the arts, the magnetization of the pinning layer antiferromagnetic material is accomplished by lowering the temperature of the pinning layer through its Néel temperature in the presence of a magnetic field.

It is of particular interest that the iron silicide layer can be formed, by operation 158 or 158', at temperatures which are near the blocking temperature of antiferromagnetic oxides that can be used in the formation of the pinning layer in operation 156. As a result, during the setting of the magnetization of the pinning layer, the temperature and the duration of the field annealing can be controlled to obtain the proper thickness and phase of the iron silicide layer.

Figure 10:
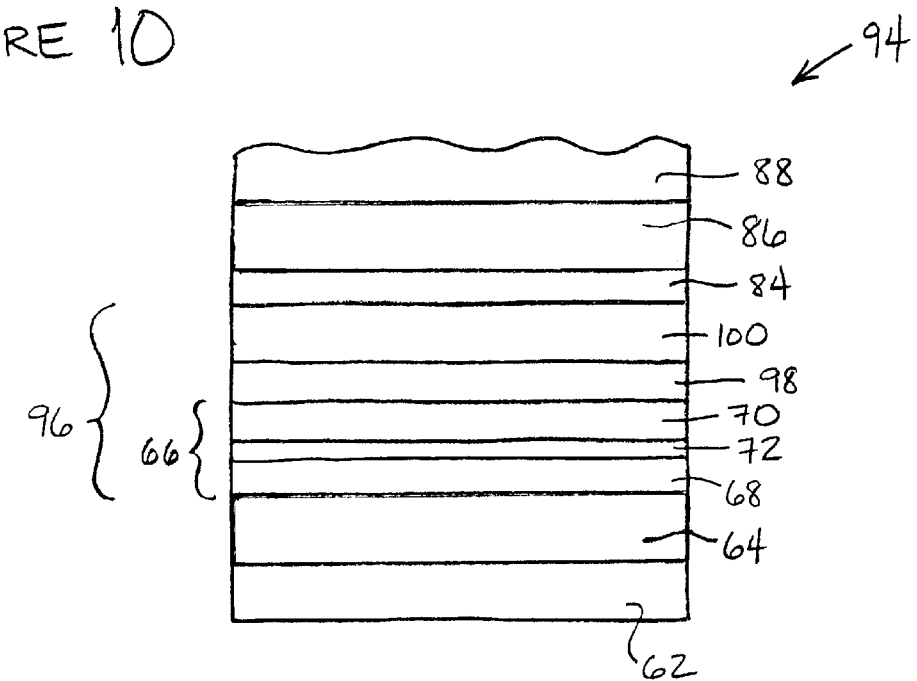
FIG. 10 is a partial end view of a spin-dependent tunneling read sensor utilizing a synthetic AFM layer according to another embodiment of the present invention.

The synthetic AFM pinned layer 66 of the present invention can also be used in other MR read sensors to provide a layer having a pinned magnetization. For example, in another embodiment of the present invention, the synthetic AFM pinned layer 66 can be used in a spin-dependent tunneling (SDT) read element 94 as shown in FIG. 10. In the SDT read element 94, the sensing layers 81 of the spin valve read element 60 are replaced with sensing layers 96. The sensing layers 96 include the synthetic AFM pinned layer 66 and a ferromagnetic layer 100, separated from each other by an insulating layer 98. The synthetic AFM pinned layer 66 is pinned by the pinning layer 64 formed of an AFM material, while the magnetization of the FM layer 100 is free to change during operation of the SDT read element 94.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A magnetoresistive device, comprising:
   a synthetic antiferromagnetic (AFM) layer including a
      first ferromagnetic (FM) layer consisting essentially of iron (Fe), a second FM layer consisting essentially of Fe, said first FM layer and said second FM layer being separated by an intermediate layer consisting essentially of Fe and silicon (Si), wherein said first FM layer has a magnetization that is pinned in a first direction, and said second FM layer has a magnetization that is pinned in a second direction that is substantially anti-parallel to said first direction;

a spacer layer overlying said synthetic AFM layer, said second FM layer being proximate said spacer layer and said first FM layer being distal said spacer layer; and a free layer overlying said spacer layer and formed of a ferromagnetic material.

2. The magnetoresistive device of claim 1 wherein said intermediate layer includes iron-silicide (FeSi).

3. The magnetoresistive device of claim 1, further comprising a pinning layer including an antiferromagnetic material, underlying said synthetic AFM layer.

4. The magnetoresistive device of claim 3, further comprising:

a first shield underlying said pinning layer;

a separation layer overlying said free layer; and a second shield overlying said separation layer.

5. The magnetoresistive device of claim 4 wherein said separation layer includes:

a metal spacer layer that is non-magnetic and adjacent said free layer; and a gap fill layer that is separated from said free layer by said metal spacer layer.

6. The magnetoresistive device of claim 5 wherein said pinning layer is formed of an oxide having antiferromagnetic properties.

7. The magnetoresistive device of claim 5 wherein said pinning layer includes one of NiO, NiCoO, NiFeO, and $Fe_2O_3$.

8. The magnetoresistive device of claim 5 wherein said pinning layer consists essentially of one of NiO, NiCoO, NiFeO, and $Fe_2O_3$.

9. The magnetoresistive device of claim 1, further comprising pinning means for pinning said magnetization of said second FM layer in said second direction.

10. The magnetoresistive device of claim 1 wherein said free layer consists essentially of a conductive ferromagnetic material and said spacer layer consists essentially of tantalum (Ta).

11. The magnetoresistive device of claim 10 wherein said conductive ferromagnetic material is CoFe.

12. The magnetoresistive device of claim 1 wherein between about 25% to about 75% of said intermediate layer is Fe and up to the remaining amount is Si.

13. The magnetoresistive device of claim 12 wherein said intermediate layer includes about 50% Fe and about 50% Si.

14. The magnetoresistive device of claim 12 wherein said intermediate layer has a thickness in the range of about 5 angstroms to about 25 angstroms.

15. The magnetoresistive device of claim 14 wherein said intermediate layer has a thickness in the range of about 10 angstroms to about 20 angstroms.

16. A system for reading from and writing to a magnetic medium, comprising:

a write element;

a read element including a spin valve magnetoresistive device having a synthetic antiferromagnetic (AFM) layer including a first FM layer, consisting essentially of iron (Fe), separated from a second FM layer, consisting essentially of iron (Fe), by a first spacer layer that consists essentially of iron (Fe) and silicon (Si).

17. The system of claim 16 wherein said first spacer layer consists essentially of iron-silicide (FeSi).

18. The system of claim 16, further comprising:

a medium support that is capable of supporting a magnetic medium and moving said medium in relation to a read/write head that includes said write element and said read element;

a read/write head support system for suspending said read/write head above said medium.

19. The system claim 18 wherein said read/write head support system includes means for moving to said read/write head relative to said medium.

20. The system of claim 18 wherein said medium support includes:

a spindle on which said medium can be supported, having an axis about which said medium can rotate; and a medium motor connected to said spindle and capable of facilitating said moving of said medium relative to said read/write head.

* * * * *